(12) United States Patent
Kazama et al.

(10) Patent No.: US 9,634,200 B2
(45) Date of Patent: Apr. 25, 2017

(54) SEMICONDUCTOR LIGHT EMITTING DEVICE

(71) Applicant: STANLEY ELECTRIC CO., LTD., Meguro-ku, Tokyo (JP)

(72) Inventors: Takuya Kazama, Tokyo (JP); Wataru Tamura, Yokohama (JP); Yasuyuki Miyake, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/990,433

(22) Filed: Jan. 7, 2016

(65) Prior Publication Data

US 2016/0211422 A1  Jul. 21, 2016

(30) Foreign Application Priority Data

Jan. 20, 2015 (JP) .................. 2015-008286

(51) Int. Cl.
*H01L 33/00* (2010.01)
*H01L 33/50* (2010.01)
(Continued)

(52) U.S. Cl.
CPC ............ *H01L 33/502* (2013.01); *H01L 33/06* (2013.01); *H01L 33/32* (2013.01); *H01L 33/382* (2013.01);
(Continued)

(58) Field of Classification Search
CPC ....... H01L 33/502; H01L 33/60; H01L 33/32; H01L 33/06; H01L 33/382;
(Continued)

(56) References Cited

U.S. PATENT DOCUMENTS

| 6,366,018 B1 | 4/2002 | Garbuzov et al. |
| 7,745,843 B2 * | 6/2010 | Baba ...................... H01L 33/20 257/95 |

(Continued)

FOREIGN PATENT DOCUMENTS

| EP | 1909335 A1 | 4/2008 |
| JP | 2002528890 A | 9/2002 |

(Continued)

OTHER PUBLICATIONS

Extended European Search Report dated Jun. 10, 2016, issued in counterpart European Application No. 16151088.8.

*Primary Examiner* — Nikolay Yushin
(74) *Attorney, Agent, or Firm* — Holtz, Holtz & Volek PC (57) ABSTRACT

A semiconductor light emitting device comprises a supporting substrate that has light reflecting characteristics; a wavelength conversion layer that is disposed on the supporting substrate, and contains semiconductor nanoparticles developing a quantum size effect; an optical semiconductor laminate that is disposed on the wavelength conversion layer and has light emitting characteristics; and a photonic crystal layer that is disposed on the optical semiconductor laminate, and that has first portions having a first refractive index and second portions having a second refractive index different from the first refractive index, the first portions and the second portions being arranged in a two-dimensional cyclic pattern.

10 Claims, 5 Drawing Sheets

(51) Int. Cl.
  *H01L 33/06* (2010.01)
  *H01L 33/32* (2010.01)
  *H01L 33/38* (2010.01)
  *H01L 33/60* (2010.01)
  *B82Y 20/00* (2011.01)

(52) U.S. Cl.
  CPC .......... *H01L 33/501* (2013.01); *H01L 33/505* (2013.01); *H01L 33/60* (2013.01); *B82Y 20/00* (2013.01); *H01L 2933/0083* (2013.01); *Y10S 977/774* (2013.01); *Y10S 977/95* (2013.01)

(58) Field of Classification Search
  CPC ..... H01L 2933/0083; H01L 2933/0041; H01L 2933/0058; Y10S 977/95; Y10S 977/774; Y10S 977/773; B82Y 20/00; B82Y 40/00
  See application file for complete search history.

(56) References Cited

U.S. PATENT DOCUMENTS

| | | | |
|---|---|---|---|
| 8,373,182 B2* | 2/2013 | Seko | H01L 33/60 257/88 |
| 2009/0267048 A1 | 10/2009 | Nakahara | |
| 2011/0133208 A1 | 6/2011 | Nakahara | |
| 2011/0182056 A1* | 7/2011 | Trottier | H01L 33/507 362/84 |
| 2015/0008393 A1 | 1/2015 | Mangum et al. | |
| 2015/0014720 A1 | 1/2015 | Tien | |

FOREIGN PATENT DOCUMENTS

| | | |
|---|---|---|
| JP | 2006059864 A | 3/2006 |
| JP | 2013149729 A | 8/2013 |
| WO | 0024024 A1 | 4/2000 |
| WO | 2010075599 A1 | 7/2010 |

* cited by examiner

SEMICONDUCTOR LIGHT EMITTING DEVICE

CROSS REFERENCE TO RELATED APPLICATION

This application is based on and claims priority on Japanese Patent Application 2015-008286, filed on Jan. 20, 2015, the entire contents of which are incorporated herein by reference.

FIELD OF THE INVENTION

The present invention relates to a semiconductor light emitting device which relies both on a photonic crystal technology and a semiconductor quantum dot technology.

BACKGROUND

A semiconductor light emitting element using a nitride semiconductor such as GaN is capable of emitting blue light (or ultraviolet), and further, radiating light (white light) having various wavelengths by using a fluorescence material (Japanese National Publication of International Patent Application No. 2002-528890). Such a semiconductor light emitting element is used for an image display apparatus, a lighting apparatus, or the like.

When a semiconductor light emitting element is used for a projector, a lighting tool for a vehicle (headlights), or the like, it is generally preferable that a directivity angle of light radiated from the device is decreased. Forming a so called photonic crystal structure on a surface of the semiconductor light emitting element makes it possible to adjust (to decrease or increase) the directivity angle of the light emitted from the semiconductor light emitting element (Japanese Laid-open Patent Publication No. 2006-059864).

SUMMARY

According to an aspect of this invention, there is provided a semiconductor light emitting device, comprising:
a supporting substrate that has light reflecting characteristics;
a wavelength conversion layer that is disposed on the supporting substrate, and contains semiconductor nanoparticles developing a quantum size effect;
an optical semiconductor laminate that is disposed on the wavelength conversion layer and has light emitting characteristics; and
a photonic crystal layer that is disposed on the optical semiconductor laminate, and that has first portions having a first refractive index and second portions having a second refractive index different from the first refractive index, the first portions and the second portions being arranged in a two-dimensional cyclic pattern.

The object and advantages of the invention will be realized and attained by means of the elements and combinations particularly pointed out in the claims.

It is to be understood that both the foregoing general description and the following detailed description are exemplary and are not restrictive of the invention, as claimed.

DESCRIPTION OF THE PREFERRED EMBODIMENTS

Hereinafter, a description will be given of a method of producing a semiconductor light emitting device (LED device), as well as of operation principles of the semiconductor light emitting device in accordance with embodiment, with reference to FIG. 1A to FIG. 5B. The manufacturing method of the LED device in accordance with the embodiment includes a step of forming a device structure on a growth substrate (FIGS. 1A and 1B), a step of forming a bonded structure by bonding the device structure to a supporting substrate (FIGS. 2A and 2B), a step of exposing a surface of the device structure by removing the growth substrate from the bonded structure (FIGS. 3A and 3B), a step of providing a photonic crystal layer on a surface of the exposed device structure (FIGS. 4A and 4B), and a step of providing a wavelength conversion layer between the device structure and the supporting substrate (FIG. 5A). It is to be noted that the relative size and the positional relationship of the components illustrated in drawings are not the same as those of actual products.

Figure 1A:
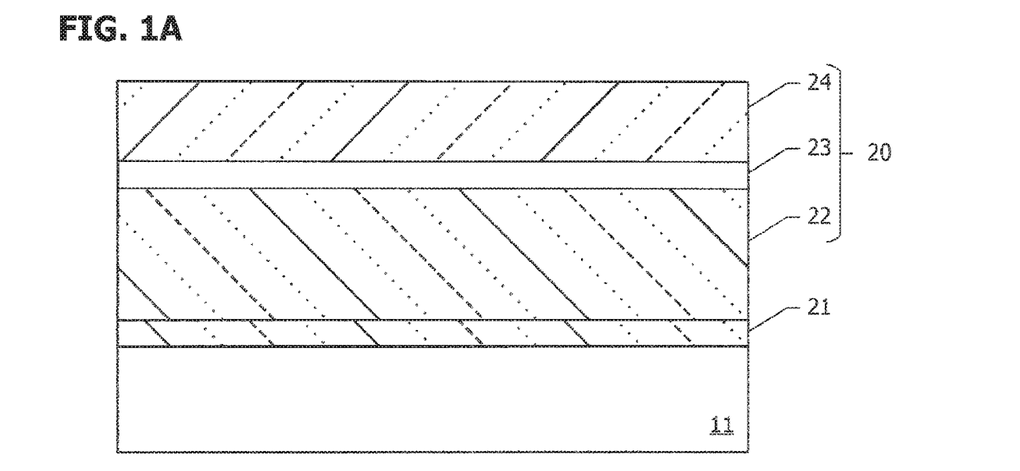
FIG. 1A and FIG. 1B are sectional views illustrating a manner in which a device structure is formed on a growth substrate.
Figure 1B:
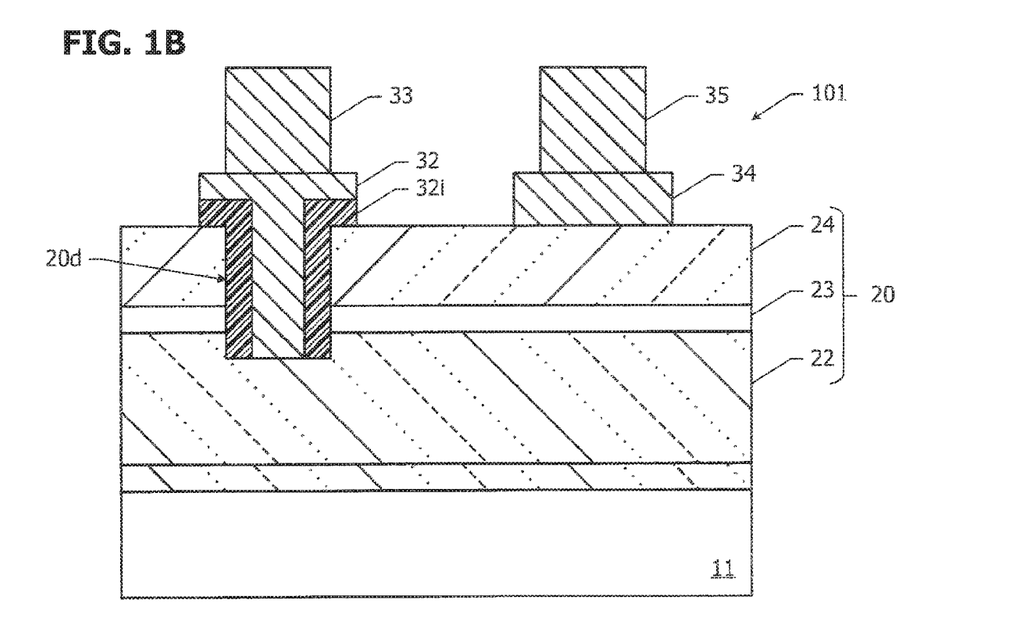

FIG. 1A and FIG. 1B illustrate a manner in which a device structure 101 is formed on a growth substrate 11. As the growth substrate 11, for example, a C surface sapphire substrate is used. In place of the sapphire surface, for example, a spinel substrate, a ZnO substrate, or the like may be used.

Referring to FIG. 1A, by using, for example, a MOCVD (metal organic chemical vapor deposition) method, a nitride-based (GaN based) semiconductor layer (optical semiconductor laminate 20) which is expressed by $Al_xIn_yGa_{1-x-y}N$ ($0 \leq x \leq 1$ and $0 \leq y \leq 1$) is formed on the growth substrate 11. First, a base buffer layer 21 made of GaN is formed on the growth substrate 11 by using TMG (trimethylgallium) and $NH_3$ as raw material gases.

Then, using TMG, $NH_3$, and $SiH_4$ as the raw material gases, an Si doped GaN layer (n-type GaN layer) is grown on the base buffer layer 21. The thickness of the n-type GaN layer may be, for example, about 5 µm. The n-type GaN layer constitutes an n-type semiconductor layer 22.

Subsequently, a well layer of InGaN is made to grow by using TMI (trimethly indium), TMG, and $NH_3$ as the raw material gases. The thickness of the well layer may be, for example, about 2 nm. Then, a barrier layer of GaN is made to grow by using TMG and $NH_3$ as the raw material gases. The thickness of the barrier layer may be, for example, about 10 nm. Then, growing of the well layer and the barrier layer are cyclically and alternatively repeated (for example, five cycles), whereby an active layer 23 having a multiple-quantum well structure is formed on the n-type semiconductor layer 22.

After that, an Mg-doped AlGaN layer (p-type AlGaN layer) is made to grow on the active layer 23, by using TMA (trimethylaluminum), TMG, $NH_3$ and CP2Mg (Biscyclopentadienylmagnesium) as the raw material gas using. The thickness of the p-type AlGaN layer may be, for example, about 15 nm. Next, an Mg-doped GaN layer (p-type GaN layer) is made to grow on the p-type AlGaN layer, by using TMG, $NH_3$ and CP2Mg as the raw material gases. The thickness of the p-type GaN layer may be, for example, about 20 nm. The p-type AlGaN layer and the p-type GaN layer constitute a p-type semiconductor layer 24.

In this way, the optical semiconductor laminate 20, in which the n-type semiconductor layer 22, the active layer 23, and the p-type semiconductor layer 24 are sequentially laminated, is formed on the growth substrate 11 through the intermediary of the base buffer layer 21. The optical semiconductor laminate 20 thus obtained has, for example, a square planar shape of about 1 mm long and wide.

Next, as illustrated in FIG. 1B, a via hole (hole) 20d is formed by removing a portion of the optical semiconductor laminate 20, by a dry etching method employing a resist mask and chlorine gas. The via hole 20d is formed to penetrate at least the p-type semiconductor layer 24 and the active layer 23, and the n-type semiconductor layer 22 is exposed at the bottom of the via hole.

Then, an n-side electrode 32, which is connected to the n-type semiconductor layer 22 through the via hole 20d, and a p-side electrode 34, which is connected to the p-type semiconductor layer 24 on a surface of the optical semiconductor laminate 20, are formed by a lift-off method, for example. As the n-side electrode 32 and the p-side electrode 34, translucent members, such as of ITO (indium tin oxide) or the like are used.

Specifically, a protective insulating layer 32i which covers the inner surface of the via hole 20d may be formed in advance, in order to avoid electrical short-circuiting between the layers constituting the optical semiconductor laminate 20 via and along the n-side electrode 32. The protective insulating layer 32i may be made of, for example, $SiO_2$, and may be formed by, for example, a sputtering method, or a dry etching method employing a resist mask and a $CF_4$/Ar gas mixture.

Next, by the lift-off method for example, an n-side bump 33 and a p-side bump 35 made of Au or the like are respectively formed on the n-side electrode 32 and the p-side electrode 34. Thicknesses (height) of the bumps 33 and 35 may be, for example, about 10 μm.

In this way, the device structure 101 is formed on the growth substrate 11 to have the optical semiconductor laminate 20, the n-side electrode 32, the n-side bump 33, the p-side electrode 34, and the p-side bump 35.

Figure 2A:
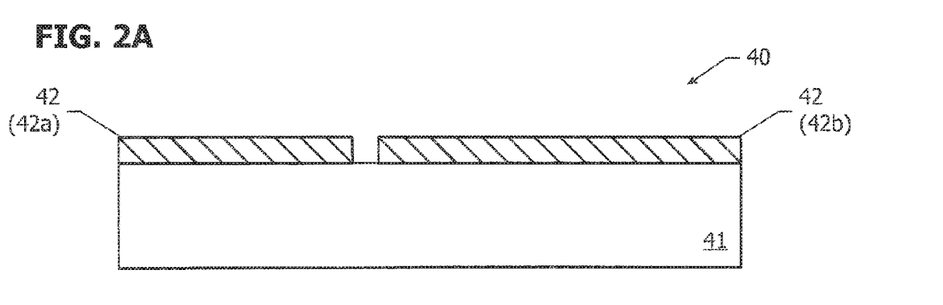
FIG. 2A and FIG. 2B are sectional views illustrating a manner in which the device structure is bonded to a supporting substrate.
Figure 2B:
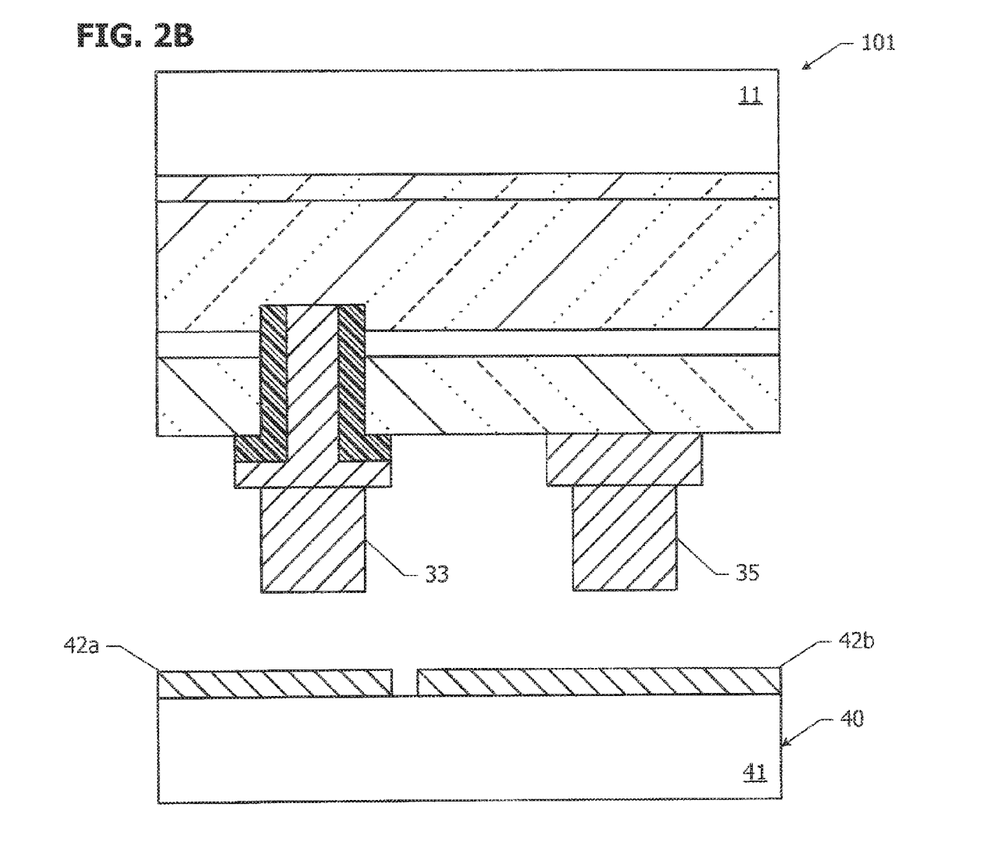

FIG. 2A and FIG. 2B illustrate a manner in which the device structure 101 on the growth substrate 11 is bonded to a supporting substrate 40. Here, the device structure 101, which is illustrated in FIG. 1B, is illustrated upside down.

First, as illustrated in FIG. 2A, the supporting substrate 40 is prepared. The supporting substrate 40 has a configuration in which a light reflective electrode 42 is provided on a surface of a base material 41. As the base material 41, for example, an Si substrate may be used. As the light reflective electrode 42, for example, a member having high light reflectivity and conductivity, such as Ag, Au, or Al, is used. It is to be noted that the light reflective electrode 42 includes first and second regions (n-side and p-side regions) 42a and 42b which are spaced from each other and not electrically connected to each other.

Subsequently, as illustrated in FIG. 2B, the supporting substrate 40 and the device structure 101 are disposed to face each other. Specifically, the first region (n-side region) 42a of the light reflective electrode 42 is disposed to face the n-side bump 33 of the device structure 101, and the second region (p-side region) 42b of the light reflective electrode 42 is disposed to face the p-side bump 35 of the device structure 101.

Next, the supporting substrate 40 and the device structure 101 are brought into contact with each other, and bonded together by, for example, fusion. The resultant structure having the supporting substrate 40 and the device structure 101 bonded together is referred to as a bonded structure 102.

Figure 3A:
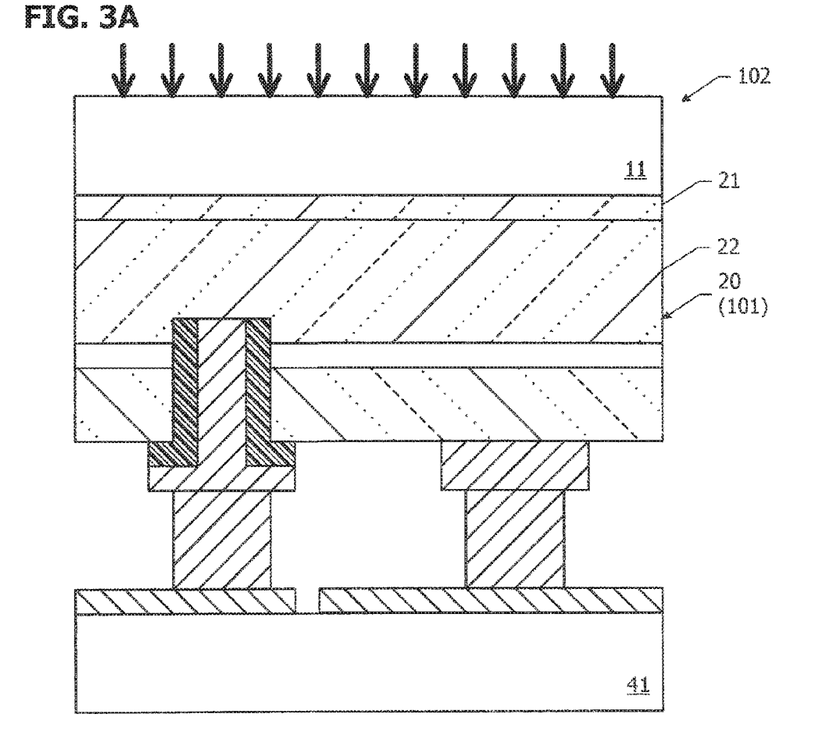
FIG. 3A and FIG. 3B are sectional views illustrating a manner in which the growth substrate is removed from the device structure.
Figure 3B:
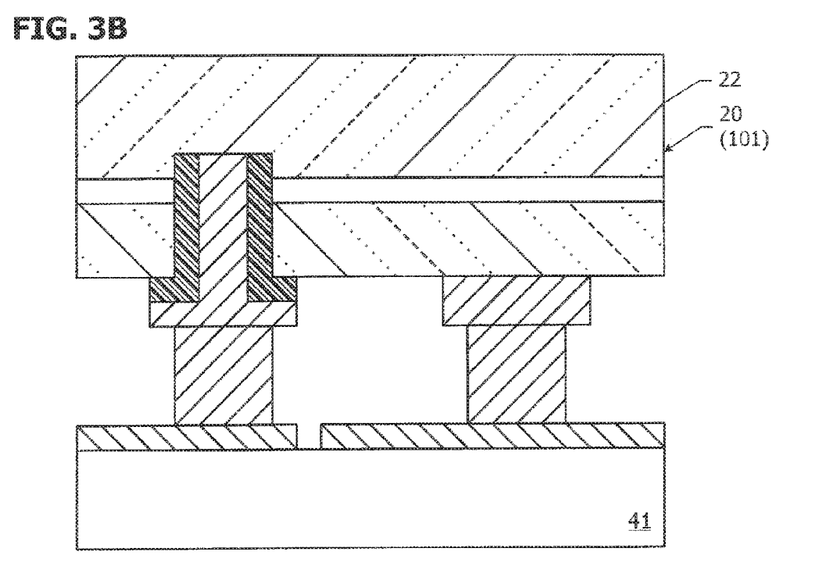

FIG. 3A and FIG. 3B illustrate a manner in which the growth substrate 11 is removed from the bonded structure 102. The growth substrate 11 can be removed by, for example, a laser lift-off method.

As illustrated in FIG. 3A, KrF excimer laser light is applied to the bonded structure from the same side as the growth substrate 11 (sapphire substrate). The base buffer layer 21 (GaN layer) absorbs the laser light which is transmitted through the growth substrate 11. The base buffer layer 21 is decomposed by heat generated by absorbed light. Consequently, the growth substrate 11 and the optical semiconductor laminate 20 (device structure 101) are separated from each other, and as illustrated in FIG. 3B, the n-type semiconductor layer 22 is exposed.

Figure 4A:
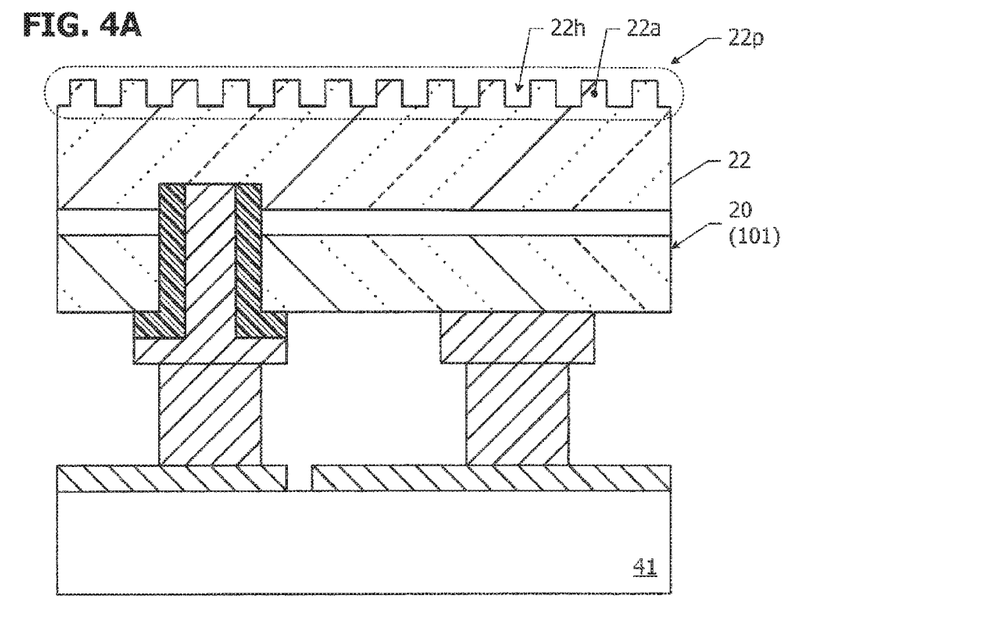
FIG. 4A is a sectional view illustrating a manner in which a photonic crystal layer is provided on a surface of the device structure.
Figure 5A:
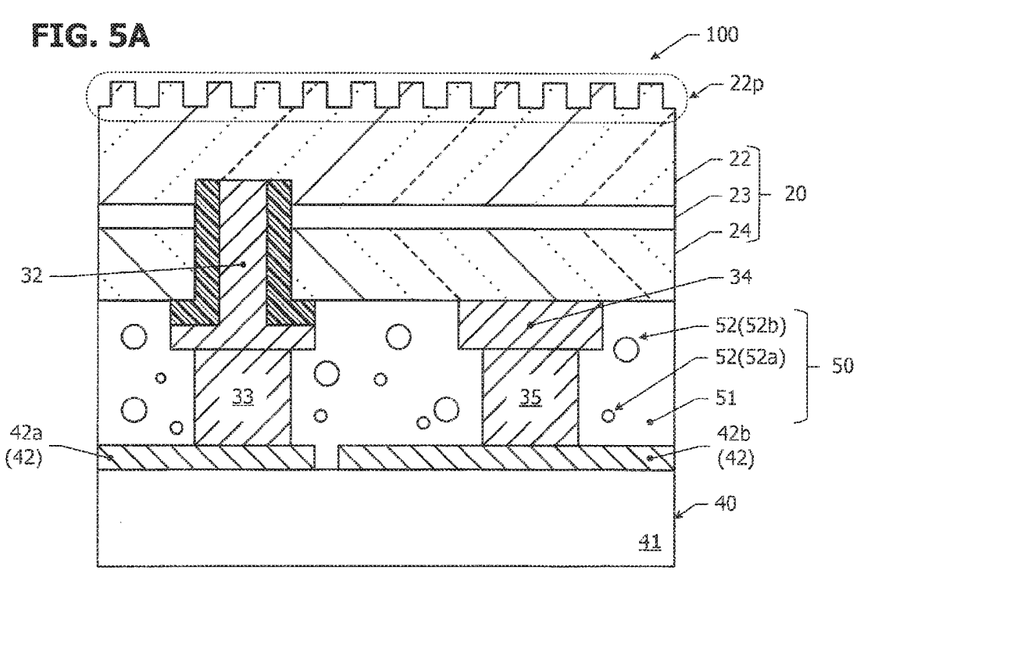
FIG. 5A is a sectional view illustrating a manner in which a wavelength conversion layer is provided between the device structure and a supporting substrate.

FIG. 4A illustrates a manner in which a photonic crystal layer 22p is formed on the exposed surface of the n-type semiconductor layer 22 (device structure 101). A resist mask having a desired pattern is formed on the surface of the n-type semiconductor layer 22 by a nanoimprint method. After that, part of the surface of the n-type semiconductor layer 22 is removed by a drying etching method employing the resist mask and a chlorine gas, thereby forming concave portions 22h distributed in a two-dimensional cyclic manner. A depth of the concave portion 22h is, for example, about 360 nm. Moreover, portions which are not removed from and remain in the surface of the n-type semiconductor layer 22 are referred to as convex portions 22a.

Figure 4B:
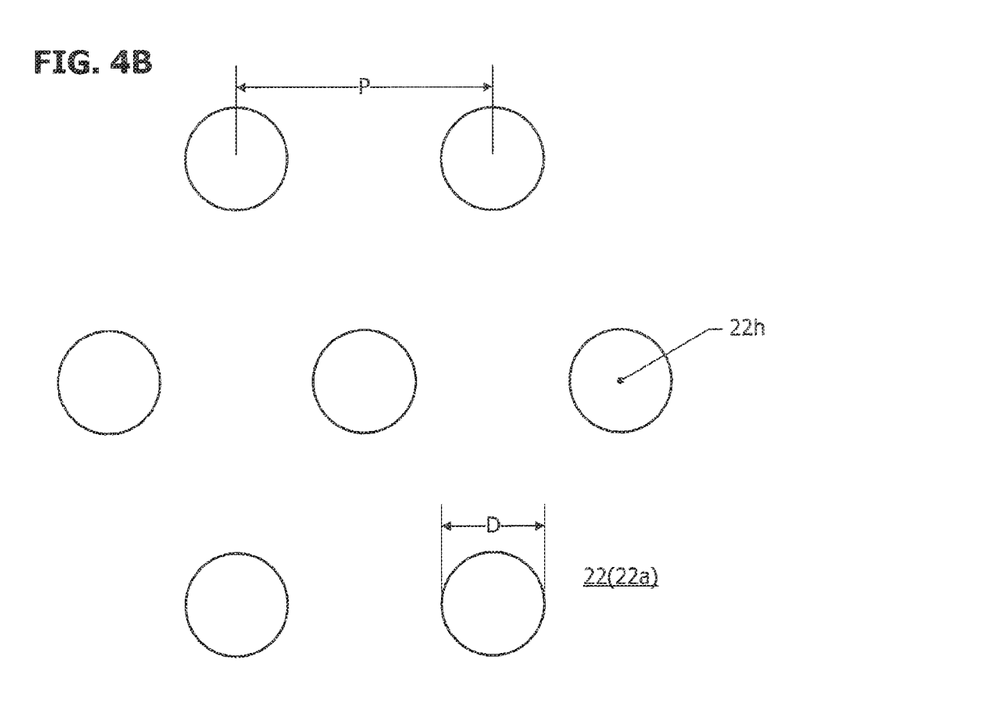
FIG. 4B is a plan view illustrating a surface state of the photonic crystal layer.

FIG. 4B illustrates a planar shape and a planar arrangement of the concave portions 22h. The planar shape of each concave portion 22h is, for example, a circle having a diameter D (approximately 200 nm). The concave portions 22h are arranged in a triangular lattice shape for example, at a pitch P (approximately 450 nm).

As seen from the above, the photonic crystal layer 22p includes the convex portions 22a made of the same material as that of the n-type semiconductor layer 22 and the concave portions 22h which are filled with atmosphere (air) after selective removal of the n-type semiconductor layer 22. A refractive index of GaN (Si doped) constituting the convex portions 22a is approximately 2.4, and a refractive index of the air filling the concave portions 22h is approximately 1.0. Thus, the photonic crystal layer 22p has a structure in which portions having different refractive indices are arranged in a two-dimensional cyclic manner.

FIG. 5A illustrates a manner in which the space between the optical semiconductor laminate 20 and the supporting substrate 40 is filled with a wavelength conversion layer 50. The wavelength conversion layer 50 has a structure in which semiconductor nanoparticles 52 developing a quantum size effect are dispersed in a binder 51. The semiconductor nanoparticles 52 may include various types of semiconductor nanoparticles 52a and 52b having different particle diameters (that is, different light emitting wavelengths). As the binder 51, for example, silicone resin can be used. In addition, as the semiconductor nanoparticle 52, for example, InP nanoparticles may be used.

More specifically, as a first step, InP nanoparticles (manufactured by NN-Labs) with light emitting wavelengths of 545 nm and 635 nm are mixed with a commercially available thermosetting silicone resin, by approximately 46 volume %. Next, the silicone resin mixed with the InP nanoparticles is injected to the space between the optical semiconductor laminate 20 and the supporting substrate 40, and then, the silicone resin is thermally cured. Consequently, the wavelength conversion layer 50 is formed provided in the space between the optical semiconductor laminate 20 and the supporting substrate 40.

In this way, an LED device 100 in accordance with the invention is completed. The LED device 100 when electrically powered emits white light (blue·green·red light) from the photonic crystal layer 22p (light emitting surface) at a reduced directivity angle.

Electrical power (current) is supplied to the optical semiconductor laminate 20, through the n-side region 42a (n-side bump 33 and n-side electrode 32 connected thereto) of the light reflective electrode and the p-side region 42b (p-side bump 35 and p-side electrode 34 connected thereto) of the light reflective electrode. Consequently, electrons which are injected from the n-side electrode 32 to the n-type semiconductor layer 22, and holes which are inserted from the p-side electrode 34 to the p-type semiconductor layer 24, are recombined in the active layer 23, with the result that energy related to the recombination is radiated as light (and heat).

A part of the light radiated from the active layer 23 is directly emitted through the surface of the n-type semiconductor layer 22 (photonic crystal layer 22p). The optical semiconductor laminate 20 in the described embodiment emits blue light (450 nm wavelength), so that the blue light is emitted from the surface of the n-type semiconductor layer 22 (photonic crystal layer 22p).

Meanwhile, the other part of the light radiated from the active layer 23 is transmitted through the wavelength conversion layer 50 and reflected by the light reflective electrode 42, and is then emitted from the surface of the n-type semiconductor layer 22 (photonic crystal layer 22p). The semiconductor nanoparticles 52a and 52b included in the wavelength conversion layer 50 absorb the light which is radiated from the optical semiconductor laminate 20, and radiates the light having wavelengths corresponding to the particle diameters. In the example, the semiconductor nanoparticles 52a and 52b absorb the light (450 nm wavelength) which is radiated from the optical semiconductor laminate 20, and radiate light beams having 545 nm wavelength and 635 nm wavelength, respectively. That is, the wavelength conversion layer 50 converts the light (blue light) radiated from the optical semiconductor laminate 20 into green light and red light. Therefore, the surface of the n-type semiconductor layer 22 (photonic crystal layer 22p) emits the green light and the red light.

Figure 5B:
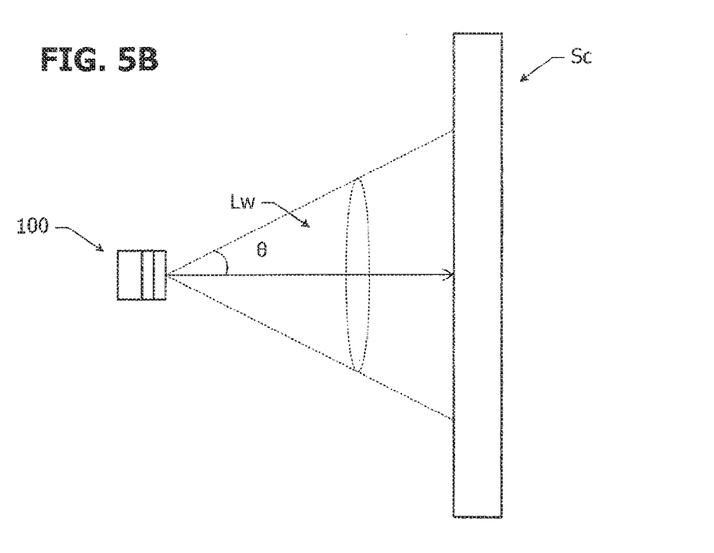
FIG. 5B is a schematic view illustrating a manner in which light emitted from the device structure is projected onto a screen.

FIG. 5B illustrates a manner in which blue, green, and red light, i.e., white light, emitted from the LED device 100, is projected on a screen Sc. The photonic crystal layer 22p (refer to FIG. 5A) is provided on the light emitting surface of the LED device 100.

On the screen Sc, the intensity of the light emitted from the LED device 100 is highest in a forward direction (direction normal to the light emitting surface), and is gradually lowered as the projected light spreads radially outward. A position where light intensity is half the light intensity in the forward direction is illustrated as an inclination angle (directivity angle) θ with respect to the forward direction. The directivity angle θ is generally used as a parameter expressing the directivity of emitted light of a light emitting device.

In a case where the photonic crystal layer 22p is not provided on the light emitting surface of the LED device 100, that is, a case in which the light emitting surface is constituted by a flat n-type semiconductor layer 22, the directivity angle θ is approximately 60°. In contrast, when the photonic crystal layer 22p is provided on the light emitting surface of the LED device 100, under the conditions of the embodiment described, the directivity angle θ is approximately 30°. Thus, the directivity angle of the white light emitted from the LED device 100 is decreased by virtue of provision of the photonic crystal layer 22p.

When the optical semiconductor laminate 20 (device structure) which radiates light of a single wavelength is required to emit light having various wavelengths, such as white light, it is an effective measure to combine the optical semiconductor laminate 20 with the wavelength conversion layer 50 including the semiconductor nanoparticle. At this time, when the wavelength conversion layer 50 is provided on the same side of the optical semiconductor laminate 20 as the photonic crystal layer 22p (light emitting surface side), the effect of the photonic crystal layer 22p to decrease the directivity angle of the emitted light is reduced. For this reason, as illustrated in FIG. 5A, the wavelength conversion layer 50 is desired to be provided on an opposite side of the photonic crystal layer 22p (light emitting surface) with respect to the optical semiconductor laminate 20.

It is also to be understood that, when total refractive index of the wavelength conversion layer 50 is smaller than the refractive index of the optical semiconductor laminate 20 (particularly, p-type semiconductor layer 24), the light radiated from the optical semiconductor laminate 20 is reflected from a boundary between the optical semiconductor laminate and the wavelength conversion layer 50, failing to be incident to the wavelength conversion layer 50. Therefore, the total refractive index of the wavelength conversion layer 50 is desired to be equal to or greater than the refractive index of the optical semiconductor laminate 20.

In the described embodiment, the optical semiconductor laminate 20 is constituted by a GaN based semiconductor (refractive index of approximately 2.4), while the wavelength conversion layer 50 is constituted by the binder 51 (refractive index of 1.4 to 1.5) and the semiconductor nanoparticles 52 of InP (refractive index of approximately 3.5). In this case, a volume ratio of the semiconductor nanoparticles with respective to the binder is preferably not less than 46%, in order to obtain a refractive index of the wavelength conversion layer not smaller than the refractive index of the optical semiconductor laminate.

In addition, in a case where the optical semiconductor laminate 20 is constituted by the GaN based semiconductor, a material having a refractive index which is at least greater than the refractive index of the GaN based semiconductor is preferably used, as the material of the semiconductor nanoparticle 52 included in the wavelength conversion layer 50. For example, the material of the semiconductor nanoparticle 52 is at least one selected from the group consisting of $AgInS_2$, $CuInS_2$, ZnSe, ZnTe, CdS, CdSe, CdTe, AlN, GaN, InN, InP, AlGaN, AlInN, and GaInN.

Although the invention has been described in terms of a specific embodiment, the invention is not limited to the described embodiment. For instance, although an LED device of a via hole electrode type (flip-chip type) has been described, the LED device may be of a surface electrode type, or the like. Any type of electrode structure may be employed provided that it allows electrical power supply to an optical semiconductor laminate. In addition, as a two-dimensional cyclic structure of the photonic crystal layer, any structure (shape and arrangement pattern of concave portion) may be used as long as it serves to decrease the directivity angle of the emitted light. A structure which increases the directivity angle of the emitted light may also be employed, depending on the use of the LED device. Other changes, modifications and combinations will be obvious to those skilled in the art.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

What are claimed are:

1. A semiconductor light emitting device, comprising:
   a supporting substrate that has light reflecting characteristics;
   a wavelength conversion layer that is disposed on the supporting substrate, and contains semiconductor nanoparticles developing a quantum size effect;
   an optical semiconductor laminate that is disposed on the wavelength conversion layer and has light emitting characteristics; and
   a photonic crystal layer that is disposed directly on the optical semiconductor laminate, and that has first portions having a first refractive index and second portions having a second refractive index different from the first refractive index, the first portions and the second portions being arranged in a two-dimensional cyclic pattern.

2. The semiconductor light emitting device according to claim 1, wherein the optical semiconductor laminate includes a GaN based semiconductor, and
   wherein the semiconductor nanoparticles are made of at least one material selected from the group consisting of $AgInS_2$, $CuInS_2$, ZnSe, ZnTe, CdS, CdSe, CdTe, AlN, GaN, InN, InP, AlGaN, AlInN, and GaInN.

3. The semiconductor light emitting device according to claim 1, wherein:
   the supporting substrate includes substrate electrodes having light reflecting characteristics, the substrate electrodes being formed on an upper surface of the supporting substrate;
   the wavelength conversion layer is disposed on the supporting substrate by contact with the substrate electrodes;
   a lower surface of the optical semiconductor laminate is in contact with an upper surface of the wavelength conversion layer;
   a lower surface of the photonic crystal layer is in contact with an upper surface of the optical semiconductor laminate;
   the first refractive index is larger than the second refractive index;
   the first portions of the photonic crystal layer are constituted by convex portions made of a semiconductor material; and
   the second portions of the photonic crystal layer are constituted by concave portions, which are shaped and arranged so that a directivity angle of light emitted from a surface of the photonic crystal layer is smaller than that of light which would be emitted from a surface of the optical semiconductor laminate in case in which the photonic crystal layer were not present.

4. The semiconductor light emitting device according to claim 1, wherein a refractive index of the semiconductor nanoparticles is greater than a refractive index of the optical semiconductor laminate.

5. The semiconductor light emitting device according to claim 4, wherein a total refractive index of the wavelength conversion layer is equal to or greater than the refractive index of the optical semiconductor laminate.

6. The semiconductor light emitting device according to claim 1, wherein the optical semiconductor laminate has a structure in which a p-type semiconductor layer, an active layer having light emitting characteristics, and an n-type semiconductor layer are stacked in order from the wavelength conversion layer side, and
   wherein the first portions of the photonic crystal layer are made of a material constituting the n-type semiconductor layer, and the second portions of the photonic crystal layer are constituted by air.

7. The semiconductor light emitting device according to claim 6, wherein:
   the supporting substrate includes substrate electrodes having light reflecting characteristics;
   the optical semiconductor laminate includes a p-side electrode and a n-side electrode, the p-side electrode connecting electrically to the p-type semiconductor layer and having light transmitting characteristics, and the n-side electrode connecting electrically to the n-type semiconductor layer and having light transmitting characteristics; and
   the semiconductor light emitting device further comprises conductive members connecting electrically between one of the substrate electrodes and the p-side electrode and between another of the substrate electrodes and the n-side electrode, respectively.

8. The semiconductor light emitting device according to claim 6, wherein the second portions of the photonic crystal layer are arranged in a triangular lattice shape.

9. The semiconductor light emitting device according to claim 6, wherein the wavelength conversion layer contains various types of semiconductor nanoparticles having different particle diameters.

10. The semiconductor light emitting device according to claim 6, wherein a directivity angle of light emitted from a surface of the photonic crystal layer is 30°.

* * * * *